United States Patent [19]

Auger

[11] 4,411,002

[45] Oct. 18, 1983

[54] METHOD AND APPARATUS FOR A CONTINUOUSLY VARIABLE SLOPE DELTA RANGE EXTENDER

[75] Inventor: Robert L. Auger, Chalfont, Pa.

[73] Assignee: Magnavox Government and Industrial Electronics Company, Fort Wayne, Ind.

[21] Appl. No.: 306,668

[22] Filed: Sep. 29, 1981

[51] Int. Cl.³ .............................................. H03K 13/22
[52] U.S. Cl. ................................. 375/30; 332/11 D; 340/347 AD
[58] Field of Search ...................... 375/27, 28, 30, 31, 375/32; 332/11 D; 333/14; 340/347 AD, 347 DA; 179/15.55 R

[56] References Cited

U.S. PATENT DOCUMENTS

| | | | |
|---|---|---|---|
| 3,806,806 | 4/1974 | Brolin | 332/11 D |
| 4,042,921 | 8/1977 | Smith | 375/30 |
| 4,151,517 | 4/1979 | Kelley | 375/28 |
| 4,215,311 | 7/1980 | Kittel et al. | 375/30 |
| 4,309,676 | 1/1982 | Martin et al. | 375/34 |

Primary Examiner—Benedict V. Safourek
Assistant Examiner—Stephen Chin
Attorney, Agent, or Firm—Thomas A. Briody; William J. Streeter; Richard T. Seeger

[57] ABSTRACT

To encode an analog to digital signal, a comparator compares an input analog signal with a reconstructed negative feedback analog signal and provides a comparison output digital bit for each comparison. A number of output digital bits is stored in a clocked shift register. A coincidence detector is coupled to the register and provides an output pulse when all the bits in the register are the same. A proportional coincidence integrator proportionally amplifies and integrates the coincidence detector output pulses. A slope polarity switch is coupled to the output of the integrator and to the first bit in the shift register and applies a polarity sign to the integrator output according to the bit value from the register. The output of the switch is integrated to form the reconstructed negative feedback analog signal which is coupled to the comparator for comparison with the input analog signal. The digital output is taken from the shift register first bit. To decode a digital to analog signal, the above circuit is used. The digital signal is applied directly to the input of the shift register, the comparator not being used for decoding. The output analog signal is the integrated output from the polarity switch.

9 Claims, 6 Drawing Figures

METHOD AND APPARATUS FOR A CONTINUOUSLY VARIABLE SLOPE DELTA RANGE EXTENDER

BACKGROUND OF THE INVENTION

This invention is in the field of analog to digital encoders and decoders, and more particularly to voice encoders and decoders.

Analog to digital encoders and decoders are well known in the art. The advantages of converting an analog signal to a digital signal for purposes of communication and processing are well known and recognized. Voice signals are analog signals that are quite complex and require a high signal to noise (S/N) ratio and low harmonic and intermodulation distortion and therefore have encoding requirements that many enoders cannot meet.

A particular encoding system that has been used to encode voice signals is known as a continuously variable slope delta (CVSD) modulator. However, even this system has undesirably low S/N ratios and high distortion levels for low intensity input signals, due to digitization and other noise and excessive harmonic and intermodulation distortion.

SUMMARY OF THE INVENTION

It is therefore an object of this invention to provide an analog to digital encoder and decoder that has an extended range of acceptable S/N ratios and distortion levels.

Another object is to provide an analog to digital encoder and decoder that is suitable for voice encoding and has an extended range of acceptable S/N ratios and distortion levels, especially for low intensity level input signals.

A further object is to provide an analog to digital voice encoder and decoder that provides a digitally coded voice signal suitable for transmission over communication networks such as a digital telephone line.

These and other objects and advantages are provided by this invention. This invention employs a CVSD type circuit. In a conventional CVSD encoder circuit, a comparator receives at its inputs the analog signal to be encoded and a reconstructed negative feedback analog signal and provides a digital output that is a "1" when the input signal is greater than the feedback signal and a "0" when it is lower. The digital output is coupled to the input of a clocked shift register which stores a number "N" bits, N typically being 3 or 4. A coincidence detector is coupled to the register and provides a coincidence pulse when all N bits in the register are the same. A resistance capacitance (RC) integrator is coupled to the detector output and passively integrates the detector pulses and inputs the integrated pulses to a slope polarity switch. The first bit in the shift register is coupled to the polarity switch and depending on whether this bit is a "1" or "0", a plus or minus sign, respectively, is given to the integrator output, and after further integration, the reconstructed negative feedback signal is applied to a comparator input for comparison with the analog input signal. The digital output is the first bit in the shift register. The CVSD decoder is similar in operation and construction to the above described encoder, but in the decoder no comparator is used and the digital signal is applied directly to the shift register. The output analog signal is the integrated output of the slope polarity switch.

The invention obtains its improved results by proportionally integrating the coincidence detector output of a CVSD circuit. The proportional integration is obtained in the disclosed embodiment by an active positive feedback integration circuit. The coincidence detector output operates a switch in the proportional integrator which connects a positive feedback amplifier output to the input of an RC integrator circuit. The capacitor voltage is the output of the integrator and is also coupled to the input of the amplifier in a positive feedback manner. Thus a proportionally higher capacitor voltage is obtained to provide a higher signal to noise ratio while maintaining gain linearity from the encoder input to decoder output.

The above and other objects and advantages of this invention will become more apparent in the following description made in reference to the following figures in the drawings.

DESCRIPTION OF A PREFERRED EMBODIMENT

Figure 1:
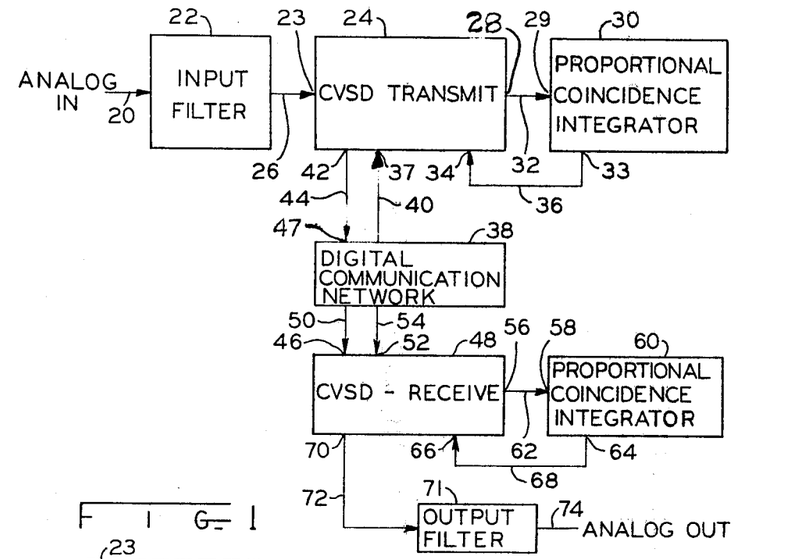
FIG. 1 is a block diagram of a communication system using the encoder and decoder of this invention.

Referring to FIG. 1, a communication channel encoder-decoder module is shown. Analog input line 20 is coupled to the input of filter 22. The output of filter 22 is coupled to input 23 of a conventional CVSD transmit (encoder) circuit 24 on line 26. A signal from coincidence detector output 28 of circuit 24 is coupled to the input 29 of proportional coincidence integrator 30 on line 32. The output 33 of integrator 30 is coupled to the slope polarity input 34 of circuit 24 on line 36. A clock signal is provided to clock input 37 of circuit 24 from Digital Communication Network 38 on clock line 40. A digital data signal from output 42 from circuit 24 is coupled to input 47 of network 38 on data line 44.

Network 38 may be a telephone communication system or other medium for transmission of digital signals. The output of network 38 is coupled to data input port 46 of CVSD Receive (decoder) circuit 48 on data line 50. A clock signal from network 38 is provided to clock input 52 of circuit 48 on clock line 54. A signal from coincidence output 56 of circuit 48 is coupled to input 58 of proportional coincidence integrator circuit 60 on line 62. The output 64 of circuit 60 is coupled to the slope polarity input 66 of circuit 48 on line 68. The reconstructed analog signal from output 70 of circuit 48 is coupled to filter 71 on line 72. The analog output of filter 70 is on line 74.

Figure 2:
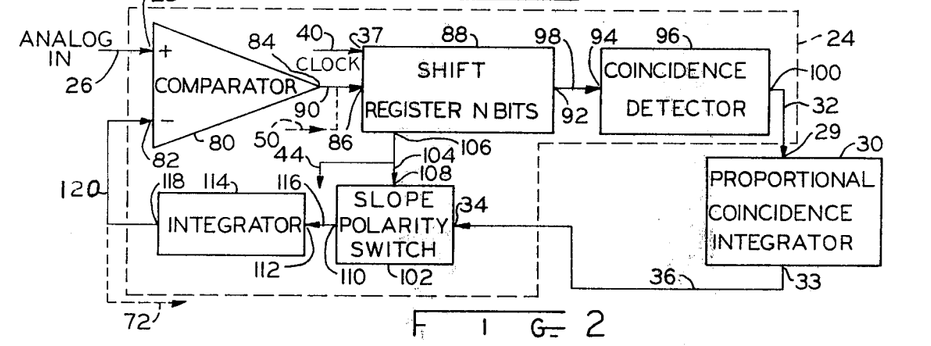
FIG. 2 is a block diagram showing the encoder and decoder of this invention, with the decoder input and output lines being dashed.

Referring to FIG. 2, a block diagram of CVSD Transmit (encode) circuit 24 and proportional coincidence integrator 30 is shown. Line 26 carrying an analog input signal is coupled to input 23 which is the plus input terminal of comparator 80. A reconstructed negative feedback signal is applied to the negative input 82 of comparator 80. Output 84 of comparator 80 is coupled to input 86 of shift register 88 on line 90. Shift register 88 has N bits, and in this embodiment N may be 3 or 4. A clock signal, which in this embodiment is 32 kHz, is applied on line 40 to clock input 37 of register 88. The output of register 88 is coupled to input 94 of coincidence detector 96 on line 98. Detector 96 compares all N bits in register 88 on each clock pulse and provides an output pulse at output 100 when there is coincidence, i.e. when all N bits are "1" or all N bits are "0". Line 32 couples output 100 to input 29 of proportional coincidence integrator 30 which proportionally amplifies and integrates the pulses from detector 96 in a manner to be described in reference to FIG. 3. The output 33 of integrator 30 is coupled to input 34 of slope polarity switch 102 on line 36. Line 104 couples output 106 of register 88 and input 108 of switch 102. The first bit of the N bits in register 88 is on line 104. Switch 102 will make the integrated output signal from integrator 30 either plus or minus, depending on whether the bit on line 104 is "1" or "0", respectively.

Output 110 of switch 102 is coupled to input 112 of integrator 114 by line 116. Integrator 114 further integrates the signal on line 116. Output 118 of integrator 114 is coupled to negative input 82 by line 120. The circuitry in box 24 is conventional and is available commercially, while that in block 30 is shown in FIG. 3.

Figure 3:
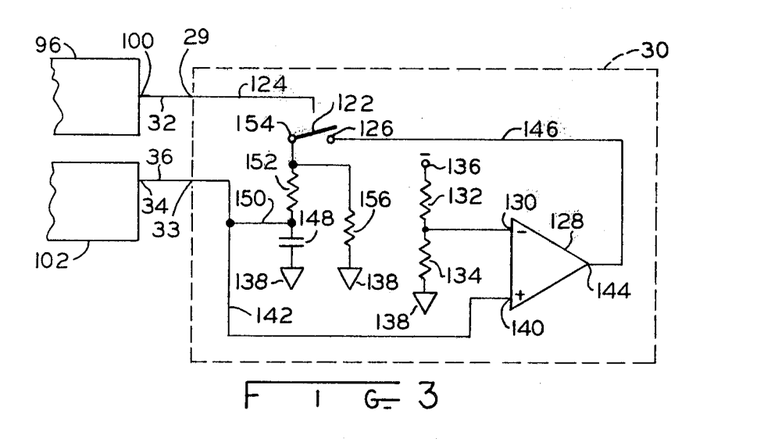
FIG. 3 is a schematic diagram of the proportional coincidence integrator of this invention.

Referring now to FIG. 3, the circuitry of integrator 30 is shown in a dashed block and has input 29 and output 33. Input 29 is coupled to output 100 of coincidence detector 96 by line 32 and output 33 is coupled to input 34 of slope polarity switch 102 by line 36. Input 29 is coupled to switch 122, which may be a semiconductor switch, by line 124 and a pulse from coincidence detector 96 on line 124 closes switch 122. When switch 122 is closed, amplifier 128 has its output 144 coupled through line 146 to switch terminal 126 and through the switch 122 to terminal 154. Resistance 152 and capacitance 148 integrate the voltage at output 144 of the amplifier 128 when the switch 122 is closed. When switch 122 is open the voltage across capacitor 148 is discharged through resistors 152 and 156 to ground 138. The positive input 140 to amplifier 128 is the voltage across capacitor 148 through lines 150 and 142. The negative input 130 to amplifier 128 is a small negative offset voltage obtained by dividing the negative voltage 136 between resistors 132 and 134 to ground 138. The small negative voltage at input 130 of amplifier 128 causes a small positive voltage at output 144 even if input 140 is zero volts. This offset voltage at input 130 is minimized, being just large enough to overcome circuit imperfections, and in one embodiment is −10 mV.

Each time switch 122 closes, the voltage across capacitor 148 increases causing input 140 of amplifier 128 to increase. This will cause the output 144 to increase proportionally and each time switch 122 closes the voltage across capacitor 148 will also continue to increase proportionally.

The gain of amplifier 128, the offset voltage applied to input 130, and the component values of the integrator 30 circuit are selected to achieve the operating curves of FIGS. 4 and 5, later described, and a gain of three for amplifier 128 has been found to be satisfactory in one model of this invention.

When switch 122 is closed by a pulse from detector 96, amplifier 128 provides an amplified signal to capacitor 148 through series resistance 152. The voltage on capacitor 148 is the integrator 30 output and provides a positive feedback to amplifier 128. Thus, when the analog signal to input 23 of comparator 80 is greater than the feedback signal at port 82, a digital "1" will be on line 90 and when the clock signal on line 40 clocks all "1"s into register 88, there will be an output from coincidence detector to integrator 30 which proportionally integrates the pulses, the integrator output increasing while the bits in register 88 remain "1"s. The first bit in register 88 is a "1" therefore switch 102 makes the feedback signal to port 82 of comparator 80 "positive". When the signal at port 82 exceeds the signal at port 23, the digital "1" on line 90 changes to a digital "0". While there is a combination of "1"s and "0"s in register 88, there will be no coincidence and no output from coincidence detector 96. When register 88 fills with "0"s, detector 96 will again feed pulses to integrator 30, building integrator 30 output to switch 102. However, since the first bit in register 88 is now an "0", switch 102 will switch the sign of the signal to port 82 from positive to negative. As soon as the signal to port 82 is more negative than the signal to port 23, the digital "0" on line 90 will change to a "1", placing "1"s in register 88.

CVSD Receive (decoder) 48 changes the digital signal to an analog signal and has similar components to those for the circuit diagram in FIG. 2 except that there is no comparator 80 and the digital input signal is fed on dashed line 50, FIG. 2, directly into shift register 88 and the output is taken from port 118 on dashed line 72. The operation is similar to that described for the remaining components which are common to the two circuits.

Figure 4:
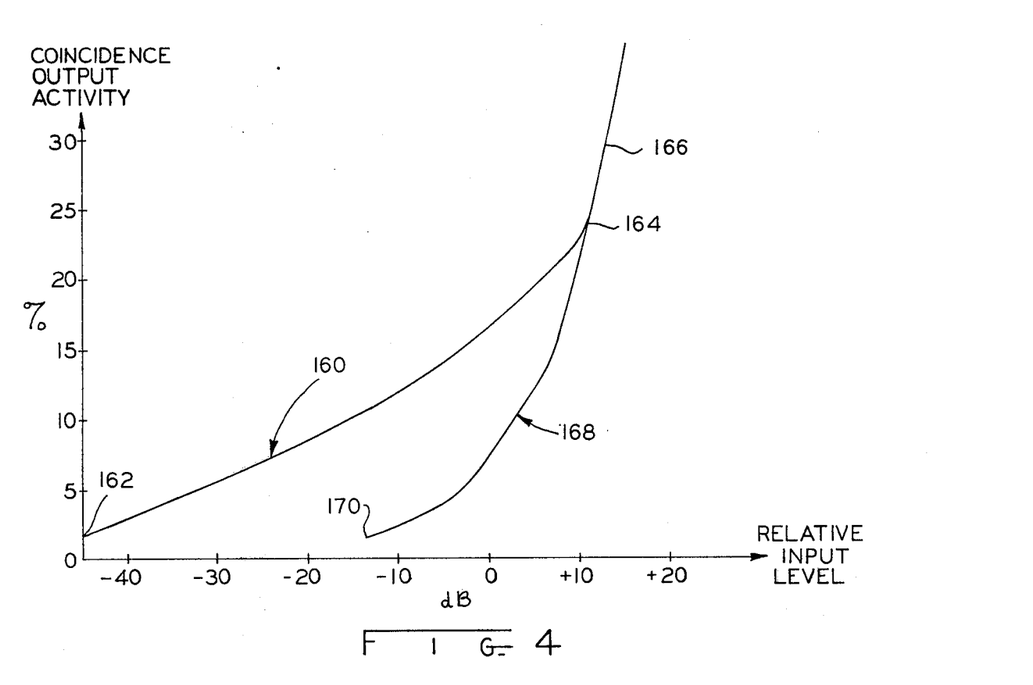
FIG. 4 is a graph showing the improvement in coincidence detector activity provided by this invention.

Referring now to FIG. 4, a graph is shown having % activity, or duty cycle, of the coincidence detector 96 plotted along the Y axis and relative input signal level in dB of an analog signal applied to input 23 plotted along the X axis. Curve 160 represents the improved CVSD modulator of this invention while curve 168 represents a conventional CVSD modulator. It is seen that when the relative input signal applied to input 23 is −12 dB, point 170 on curve 168, a 2% activity level is obtained, while on curve 160 a much lower signal level, −42 dB, obtains the same 2% activity level, shown at point 162. The curve 160 activity level is higher for all input signal levels up to point 164 on the curves, and at that point, amplifier 128 saturates and the two curves are substantially the same for all higher input levels. Thus for low level input signals, the % activity level of coincidence detector 96 is higher for curve 160 resulting in lower S/N levels, lower distortion, and gain linearity.

Figure 5:
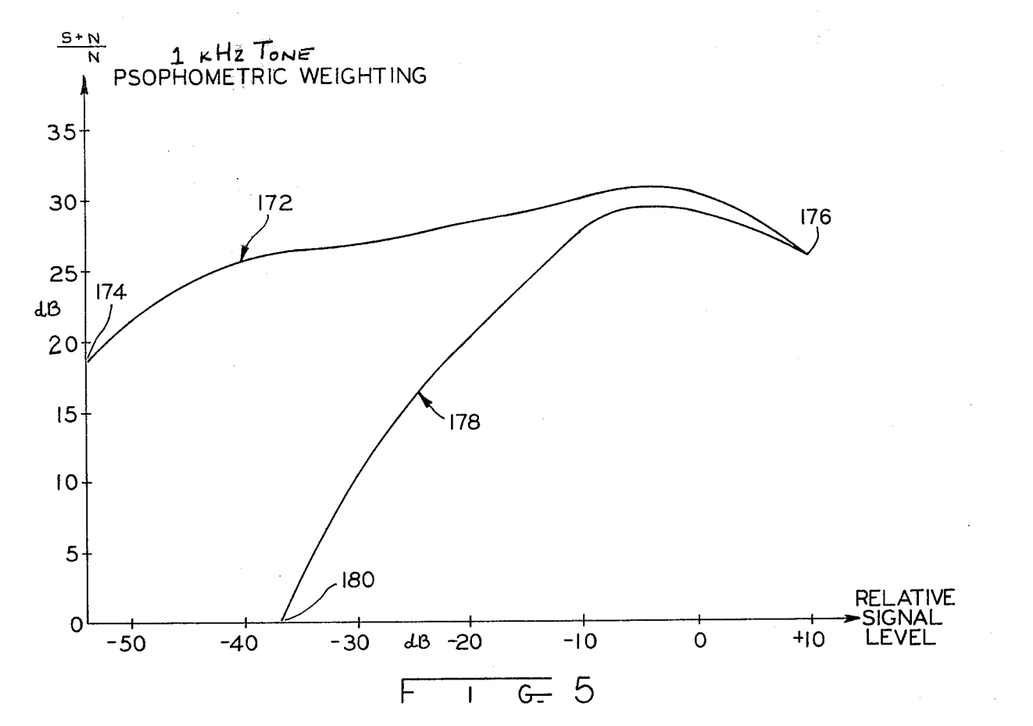
FIG. 5 is a graph showing the improvement in signal to noise ratio provided by this invention.

Referring now to FIG. 5, Signal+Noise/Noise (S+N/N) is plotted in dB along the Y axis and relative input signal level is plotted along the X axis. Curve 172 is a plot of an average of a number of models built according to the principles of this invention and plot 178 is for a conventional CVSD modulator. It is seen that at point 174 of curve 172, the S+N/N ratio is about 20 dB for an input level of −52 dB, whereas at point 180 of curve 178 the S+N/N ratio is only 0 dB at a stronger relative input of −37 dB. At point 176 the curves 172, 178 join. For curve 172, the gain linearity is better than +/−0.5 dB for relative input levels from −40 dB to +3 dB, at least as good as that for curve 178. Gain linearity is very important in reducing intermodulation distortion when more than one tone is present, as would be the case in a voice signal.

As mentioned, the gain of amplifier 128 affects performance. For example, as the gain of amplifier 128 is increased, curve 160 is moved to the right until it coincides with curve 168. Lowering the gain of amplifier 128 will flaten curve 160 to nearly a horizontal line, providing very little variation in % activity per change in relative input level. Thus, the gain of amplifier is carefully adjusted to obtain the desired results.

Figure 6:
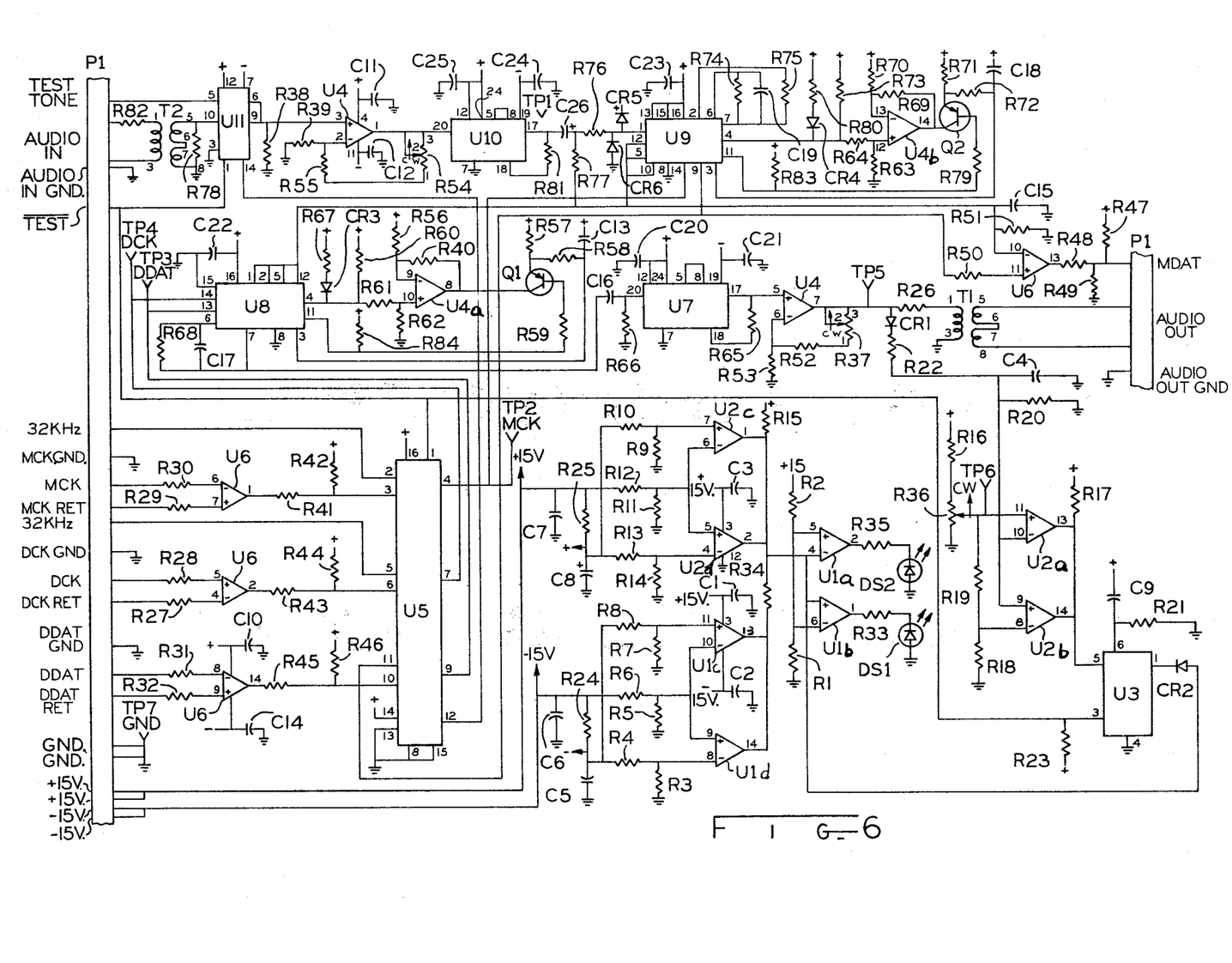
FIG. 6 is a schematic diagram of an encoder-decoder embodiment of this invention.

FIG. 6 is a schematic diagram of an embodiment having both an encoder-decoder channel module, shown in the upper half of the diagram, and a test circuit for the module, shown in the lower half of the diagram. The various inputs and outputs are applied to connector P1, the symbols for the signals being placed opposite the lines which they identify. Integrated circuits (IC) U1–U11 and their respective pin numbers are shown in FIG. 6. The circuits for the blocks in FIGS. 1-3 are in the channel module portion of the diagram. ICs U10, U7 are filters 22, 71 (FIG. 1) respectively. ICs U9, U8 are CVSD Receive circuit 24 and CVSD Transmit circuit 48 respectively. IC sections U4b, U4a are amplifiers in proportional coincidence integrators 30, 60 (FIG. 1) respectively; and switching transistors Q2, Q1 are switches 122 (FIG. 3) for integrators 30, 60 respectively. FIG. 6 resistances R72, R71, R64, R63 are FIG. 3 resistances 152, 156, 132, and 134 respectively. FIG. 6 capacitance C18 is FIG. 3 capacitance 148. It is noted that the offset voltage in FIG. 3 is applied to the negative input 130 of amplifier 128 while in FIG. 6 the offset voltage is applied to the positive terminal of amplifier U4b. In FIG. 6, Audio In is placed across the primary winding of transformer T2 and Audio Out is taken from the secondary winding of transformer T1.

The lower half of the circuit in FIG. 6 is for applying a test tone and circuit check and will be generally described. Control cards having test parameters are utilized to furnish the test inputs including audio tone and clock signals to check the channel module. IC U6 has three sections for interfacing between the received signals and IC U5 is a selector for internal or external clock signals. IC U1 and U2 sections c and d are for sensing power supply current; IC U2 sections U2a, U2b sense whether the tested output is above or below the expected levels; IC U3 is a latch which remembers the result of a previous test.

In connector P1, the symbol representations are given in the following table:

MCK—modulator clock
DCK—demodulator clock
MDAT—modulator data
DDAT—demodulator data
GND—ground
TP1—test point 1 to filter
TP2—test point 2 to modulator clock
TP3—test point 3 to demodulator data
TP4—test point 4 to decoder clock
TP5—test point 5 to analog output
TP6—test point 6 to set level for expected test signal
TP7—test point 7 to ground "Encoder" may be substituted for "modulator" and "decoder" may be substituted for "demodulator" in the above table.

The component values for FIG. 6 are as follows:

| Resistors: | | |
|---|---|---|
| R1 51K | R29 5.6K | R57 5.62K |
| R2 51K | R30 5.6K | R58 56.2K |
| R3 56.2K | R31 5.6K | R59 100.0K |
| R4 2.05K | R32 5.6K | R60 4.75K |
| R5 56.2K | R33 1.3K | R61 69.8K |
| R6 6.34K | R34 56K | R62 1.00M |
| R7 56.2K | R35 1.3K | R63 1.00M |
| R8 5.62K | R36 50K | R64 69.8K |
| R9 56.2K | R37 5K | R65 133K |
| R10 2.05K | R38 100K | R66 51K |
| R11 56.2K | R39 221 | R67 1.00K |
| R12 6.34K | R40 200.0K | R68 20.0K |
| R13 5.62K | R41 51K | R69 200.0K |
| R14 56.2K | R42 47K | R70 100.0K |
| R15 51K | R43 51K | R71 5.62K |
| R16 57.6K | R44 47K | R72 56.2K |
| R17 51K | R45 51K | R73 4.75K |
| R18 34.8K | R46 47K | R74 20.0K |
| R19 30K | R47 51K | R75 5.1K |
| R20 274.0K | R48 39K | R76 1K |
| R21 510K | R49 27K | R77 5.1K |
| R22 30.1K | R50 5.6K | R78 215 |
| R23 100K | R51 3.6K | R79 100K |
| R24 22.1 | R52 3.01K | R80 1.00K |
| R25 12.7 | R53 4.22K | R81 133K |
| R26 562 | R54 5K POT. | R82 294 |
| R27 5.6K | R55 7.50K | R83 18K |
| R28 5.6K | R56 100.0K | R84 18K |

All resistors are in ohms and are ¼ W 5%.

| Capacitors in μfd: | | |
|---|---|---|
| C1 .1 | C10 .1 | C19 .1 5% |
| C2 .1 | C11 .1 | C20 .1 |
| C3 .1 | C12 .1 | C21 .1 |
| C4 .15 | C13 .15 5% | C22 .1 |
| C5 47 35V | C14 .1 | C23 .1 |
| C6 .1 | C15 .47 | C24 .1 |
| C7 .1 | C16 .47 | C25 .1 |
| C8 47 35V | C17 .1 5% | C26 1 |
| C9 .1 | C18 .15 5% | |

Integrated Circuits:

U1, U2, U6—LM 139, National Semiconductor, Inc. Santa Clara, Calif.
U3—4013, U5—40257, RCA Semiconductor, Princeton, N.J.
U4—A 1-4602-8, Harris Semiconductor, Melbourne, Fla.
U7, U10—AF 133-2, National Semiconductor, Inc. Santa Clara, Calif.
U8, U9—MC 3517, Motorola Semiconductor, Phoenix, Ariz.
U11—DG 200, Siliconics, Santa Clara, Calif.
Q1, Q2—2N2907A, Motorola Semiconductor, Phoenix, Ariz.
Diodes:
CR1 to CR6—IN 4148, Motorola Semiconductor, Phoenix, Ariz.
Transformers:
T1, T2—ASD-955, TRW-UTC, New York, N.Y.

The above discloses and describes a preferred embodiment of this invention and is by way of example, the scope of this invention being defined in the claims which follow.

What is claimed is:

1. A continuously variable slope delta modulator range extender apparatus comprising:
   first means for comparison of an input analog signal and a reconstructed negative feedback analog signal and having an output and providing digital bits at said output corresponding to said comparison;

second means comprising a register having N positions and coupled to the output of said first means for storing in said register the most recent N number of said digital bits and having an output at which the value of the bit in one of said N positions is present;

third means coupled to said second means for detecting coincidence of said N number of bits stored at any one time and having an output at which is a signal corresponding to the state of coincidence;

fourth means coupled to said third means output for integrating and amplifying said third means output signal and providing an output signal corresponding to said integration and amplification;

fifth means coupled to said second means output for sensing the value of the bit in said one position and being coupled to said fourth means for receiving said fourth means output signal; said fifth means coupled to said first means for applying a polarity sign to said fourth means output signal corresponding to the value of said sensed one bit to provide said reconstructed negative feedback analog signal to said first means;

said fourth means comprising a switch; an amplifier having an input and output; a resistance capacitance integrating circuit; said switch being coupled between said amplifier output and said resistance capacitance circuit; said amplifier input being coupled to said capacitance whereby when said switch is closed said amplifier is started thereby charging said integrating circuit, said capacitance charge being amplified by said amplifier to increase the amplifier output signal to said integrating circuit; said switch being coupled to said third means output and being closed on each sensed coincidence by said third means, the gain of said amplifier being adjusted to obtain at least one of desired signal to noise ratios, distortion levels, and gain linearities.

2. A continuously variable slope delta modulator range extender apparatus comprising:

first means having an output for providing a digital signal having a stream of digital bits at its output;

second means comprising a register having N positions and coupled to the output of said first means for storing in said register the most recent N number of said digital bits and having an output at which the value of the bit in one of said N positions is present;

third means coupled to said second means for detecting coincidence of said N number of bits stored at any one time and having an output at which is a signal corresponding to the state of coincidence;

fourth means coupled to said third means output for integrating and amplifying said third means output signal and providing an output signal corresponding to said integration and amplification;

fifth means coupled to said second means output for sensing the value of the bit in said one position and being coupled to said fourth means for receiving said fourth means output signal; said fifth means coupled to said first means for applying a polarity sign to said fourth means output signal corresponding to the value of said sensed one bit to provide said reconstructed negative feedback analog signal to said first means;

said fourth means comprising a switch; an amplifier having an input and output; a resistance capacitance integrating circuit; said switch being coupled between said amplifier output and said resistance capacitance circuit; said amplifier input being coupled to said capacitance whereby when said switch is closed said amplifier is started thereby charging said integrating circuit, said capacitance charge being amplified by said amplifier to increase the amplifier output signal to said integrating circuit.

3. A continuously variable slope delta modulator range extender apparatus comprising:

first means for comparison of an input analog signal and a reconstructed negative feedback analog signal and having an output and providing digital bits at said output corresponding to said comparison;

second means comprising a register having N positions and coupled to the output of said first means for storing in said register the most recent N number of said digital bits and having an output at which the value of the bit in one of said N positions is present;

third means coupled to said second means for detecting coincidence of said N number of bits stored at any one time and having an output at which is a signal corresponding to the state of coincidence;

fourth means coupled to said third means output for integrating and amplifying said third means output signal and providing an output signal corresponding to said integration and amplification;

fifth means coupled to said second means output for sensing the value of the bit in said one position and being coupled to said fourth means for receiving said fourth means output signal; said fifth means coupled to said first means for applying a polarity sign to said fourth means output signal corresponding to the value of said sensed one bit to provide said reconstructed negative feedback analog signal to said first means;

sixth means for transmitting a digital signal from a first location to a second location; said sixth means being coupled at said first location to said one position of said second means for receiving said digital bits at said one position;

said sixth means for providing a digital signal having a stream of said transmitted digital bits;

seventh means coupled to said sixth means for receiving said digital signal having a stream of digital bits and having a register having N positions for storing in said register the most recent N number of said digital bits and having an output at which the value of the bit in one of said N positions is present;

eighth means coupled to said seventh means for detecting coincidence of said N number of bits stored at any one time and having an output at which is a signal corresponding to the state of coincidence;

ninth means coupled to said eighth means for integrating and amplifying said eighth means output signal and providing an output signal corresponding to said integration and amplification;

tenth means coupled to said seventh means output for sensing the value of the bit in said one position and being coupled to said ninth means for receiving said ninth means output signal; said tenth means coupled to said ninth means for applying a polarity sign to said fourth means output signal corresponding to the value of said sensed one bit to provide an analog signal;

said fourth means and said ninth means each comprises: a switch; an amplifier having an input and output; a resistance capacitance integrating circuit;

said switch being coupled between said amplifier output and said integrating circuit; said amplifier input being coupled to said capacitance whereby when said switch is closed said amplifier is started thereby charging said integrating circuit, said capacitance charge being coupled to and amplified by said amplifier to increase the amplifier output signal to said integrating circuit; said switch in said fourth means being coupled to said third means output and said switch in said ninth means being coupled to said eighth means output and said switches being closed on each sensed coincidence by said third means and said eighth means, respectively, the gain of each of said amplifiers being adjusted to obtain at least one of desired signal to noise ratios, distortion levels, and gain linearities.

4. A continuously variable slope delta modulator range extender apparatus comprising:

first means for comparison of an input analog signal and a reconstructed negative feedback analog signal and having an output and providing digital bits at said output corresponding to said comparison;

second means comprising a register having N positions and coupled to the output of said first means for storing in said register the most recent N number of said digital bits and having an output at which the value of the bit in one of said N positions is present;

third means coupled to said second means for detecting coincidence of said N number of bits stored at any one time and having an output at which is a signal corresponding to the state of coincidence;

fourth means coupled to said third means output for integrating and amplifying said third means output signal and providing an output signal corresponding to said integration and amplification;

said fourth means comprising an integrator; a circuit having a positive feedback amplifier coupled to said integrator; and a discharge circuit being coupled to said integrator; said third means being coupled to said fourth means circuit to actuate said amplifier to charge said integrator circuit each time a coincidence is sensed, said integrator discharging into said discharge circuit in the absence of a coincidence being sensed and until the next coincidence is sensed; the gain of said amplifier being adjusted to obtain at least one of desired signal to noise ratios, distortion levels, and gain linearities;

fifth means coupled to said second means output for sensing the value of the bit in said one position and being coupled to said fourth means for receiving said fourth means output signal; said fifth means coupled to said first means for applying a polarity sign to said fourth means output signal corresponding to the value of said sensed one bit to provide said reconstructed negative feedback analog signal to said first means.

5. A continuously variable slope delta modulator range extender apparatus comprising:

first means having an output for providing a digital signal having a stream of digital bits at its output;

second means comprising a register having N positions and coupled to the output of said first means for storing in said register the most recent N number of said digital bits and having an output at which the value of the bit in one of said N positions is present;

third means coupled to said second means for detecting coincidence of said N number of bits stored at any one time and having an output at which is a signal corresponding to the state of coincidence;

fourth means coupled to said third means output for integrating and amplifying said third means output signal and providing an output signal corresponding to said integration and amplification;

said fourth means comprising an integrator; a circuit having a positive feedback amplifier coupled to said integrator; and a discharge circuit being coupled to said integrator; said third means being coupled to said fourth means circuit to actuate said amplifier to charge said integrator circuit each time a coincidence is sensed, said integrator discharging into said discharge circuit in the absence of a coincidence being sensed and until the next coincidence is sensed; the gain of said amplifier being adjusted to obtain at least one of desired signal to noise ratios, distortion levels, and gain linearities;

fifth means coupled to said second means output for sensing the value of the bit in said one position and being coupled to said fourth means for receiving said fourth means output signal; said fifth means coupled to said first means for applying a polarity sign to said fourth means output signal corresponding to the value of said sensed one bit to provide said reconstructed negative feedback analog signal to said first means.

6. A continuously variable slope delta modulator range extender apparatus comprising:

first means for comparison of an input analog signal and a reconstructed negative feedback analog signal and having an output and providing digital bits at said output corresponding to said comparison;

second means comprising a register having N positions and coupled to the output of said first means for storing in said register the most recent N number of said digital bits and having an output at which the value of the bit in one of said N positions is present;

third means coupled to said second means for detecting coincidence of said N number of bits stored at any one time and having an output at which is a signal corresponding to the state of coincidence;

fourth means coupled to said third means output for integrating and amplifying said third means output signal and providing an output signal corresponding to said integration and amplification;

fifth means coupled to said second means output for sensing the value of the bit in said one position and being coupled to said fourth means for receiving said fourth means output signal; said fifth means coupled to said first means for applying a polarity sign to said fourth means output signal corresponding to the value of said sensed one bit to provide said reconstructed negative feedback analog signal to said first means;

sixth means for transmitting a digital signal from a first location to a second location; said sixth means being coupled at said first location to said one position of said second means for receiving said digital bits at said one position;

said sixth means for providing a digital signal having a stream of said transmitted digital bits;

seventh means coupled to said sixth means for receiving said digital signal having a stream of digital bits and having a register having N positions for storing in said register the most recent N number of said digital bits and having an output at which the value of the bit in one of said N positions is present;

eighth means coupled to said seventh means for detecting coincidence of said N number of bits stored at any one time and having an output at which is a signal corresponding to the state of coincidence;

ninth means coupled to said eighth means for integrating and amplifying said eighth means output signal and providing an output signal corresponding to said integration and amplification;

tenth means coupled to said seventh means output for sensing the value of the bit in said one position and being coupled to said ninth means for receiving said ninth means output signal; said tenth means coupled to said ninth means for applying a polarity sign to said fourth means output signal corresponding to the value of said sensed one bit to provide an analog signal;

said fourth means and said ninth means each comprises: an integrator; a circuit having a positive feedback amplifier coupled to said integrator; and a discharge circuit being coupled to said integrator; said third means being coupled to said fourth means circuit to actuate said fourth means amplifier to charge said fourth means integrator each time a coincidence is sensed by said third means, and said eighth means coupled to said ninth means for actuating said ninth means amplifier to charge said ninth means integrator each time a coincidence is sensed by said eighth means; said fourth means and ninth means integrators each discharging into their respective said discharge circuits in the absence of a coincidence being sensed by said third means and said ninth means, respectively, and until the next coincidence is sensed by said third means and said ninth means, respectively; the gain of each of said fourth means and ninth means amplifiers each being adjusted to obtain at least one of desired signal to noise ratios, distortion levels, and gain linearities.

7. The method of encoding an analog signal to a digital signal comprising the steps of:

comparing an input analog signal and a reconstructed negative feedback analog signal and providing digital bits corresponding to said comparing;

storing in a register having N positions the most recent N number of said digital bits and providing a bit output signal corresponding to the value of the bit in one position of said N positions;

detecting coincidence of said N number of bits stored at any one time and emitting a first output signal corresponding to the state of coincidence;

integrating and amplifying said first output signal and providing a second output signal corresponding to said integration and said amplification comprising the steps of coupling a positive feedback amplifier across an integration circuit having an input and an output whereby the integrating circuit output is amplified and applied to the integrating circuit input; starting said amplifier for each state of coincidence; adjusting the gain of the amplifier to obtain at least one of desired signal to noise ratios, distortion levels, and gain linearities;

sensing the value of said bit output signal in said one position and receiving said second output signal; applying a polarity sign to said second output signal corresponding to the value of said bit output signal to provide a signed analog signal which comprises said reconstructed negative feedback analog signal.

8. The method of decoding a digital signal to an analog signal comprising the steps of:

providing a digital signal having a stream of digital bits;

storing in a register having N positions the most recent N number of said digital bits and providing a bit output signal corresponding to the value of the bit in one position of said N positions;

detecting coincidence of said N number of bits stored at any one time and emitting a first output signal corresponding to the state of coincidence;

integrating and amplifying said first output signal and providing a second output signal corresponding to said integration and said amplification comprising the steps of coupling a positive feedback amplifier across an integration circuit having an input and an output whereby the integrating circuit output is amplified and applied to the integrating circuit input; starting said amplifier for each state of coincidence; adjusting the gain of the amplifier to obtain at least one of desired signal to noise ratios, distortion levels, and gain linearities;

sensing the value of said bit output signal in said one position and receiving said second output signal; applying a polarity sign to said second output signal corresponding to the value of said bit output signal to provide a signed analog signal.

9. A communication system method comprising the steps of:

a first step of comparing an input analog signal and a reconstructed negative feedback analog signal and providing digital bits corresponding to said comparing;

a second step of storing in a register having N positions the most recent N number of said digital bits and providing a bit output signal corresponding to the value of the bit in one position of said N positions;

a third step of detecting coincidence of said N number of bits stored at any one time and emitting a first output signal corresponding to the state of coincidence;

a fourth step of integrating and amplifying said first output signal and providing a second output signal corresponding to said integration and said amplification comprising the steps of coupling a positive feedback amplifier across an integration circuit having an input and an output whereby the integrating circuit output is amplified and applied to the integrating circuit input; starting said amplifier for each state of coincidence; adjusting the gain of the amplifier to obtain at least one of desired signal to noise ratios, distortion levels, and gain linearities;

a fifth step of sensing the value of said bit output signal in said one position and receiving said second output signal; applying a polarity sign to said second output signal corresponding to the value of said bit output signal to provide a signed analog signal which comprises said reconstructed negative feedback analog signal;

a sixth step of transmitting from a first location to a second location a digital signal stream of digital bits from said second step bit output signal;

a seventh step of storing in a register having N positions the most recent N number of said sixth step digital bits and providing a bit output signal corresponding to the value of the bit in one position of said N positions;

an eighth step of detecting coincidence of said N number of bits stored at any one time and emitting an output signal corresponding to the state of coincidence;

a ninth step of integrating and amplifying said eighth step output signal and providing an output signal corresponding to said integration and said amplification comprising the steps of coupling a positive feedback amplifier across an integration circuit having an input and an output whereby the integrating circuit output is amplified and applied to the integrating circuit input; starting said amplifier for each state of coincidence; discharging said integrating circuit in the absence of a state of coincidence until the next state of coincidence; adjusting the gain of the amplifier to obtain at least one of desired signal to noise ratios, distortion levels, and gain linearities;

a tenth step of sensing the value of said seventh step bit output signal in said one position and receiving said ninth step output signal; applying a polarity sign to said ninth step output signal corresponding to the value of said seventh step bit output signal to provide a signed analog signal.

* * * * *

UNITED STATES PATENT AND TRADEMARK OFFICE
CERTIFICATE OF CORRECTION

PATENT NO. : 4,411,002

DATED : October 18, 1983

INVENTOR(S) : Robert L. Auger

It is certified that error appears in the above—identified patent and that said Letters Patent is hereby corrected as shown below:

Col. 7, l. 10 for "the" read --a--;
Col. 7, l. 52 for "the" read --a--;
Col. 8, l. 23 for "the" read --a--;
Col. 8, l. 53 for "the" read --a--;
Col. 9, l. 32 for "the" read --a--;
Col. 10, l. 4 for "the" read --a--;
Col. 10, l. 45 for "the" read --a--;
Col. 11, l. 7 for "the" read --a--;
Col. 11, l. 53 for "the" read --a--;
Col. 11, l. 56 for "integration" read --integrating--;
Col. 11, l. 56 for "amplification" read --amplifying--;
Col. 11, l. 58 for "integration" read --integrating--;
Col. 11, l. 59 for "the" read --said--;
Col. 11, l. 60 for "the" read --said--;
Col. 11, l. 62 for "the" second occurrence read --said--;
Col. 12, l. 14 for "the" read --a--;
Col. 12, l. 17 for "integration" read --integrating--;
Col. 12, l. 17 for "amplification" read --amplifying--;
Col. 12, l. 19 for "integration" read --integrating--;
Col. 12, l. 20 for "the" read --said--;
Col. 12, l. 21 for "the" read --said--;
Col. 12, l. 23 for "the" read --said--;
Col. 12, l. 44 for "the" read --a--;
Col. 12, l. 48 for "integration" read --integrating--;
Col. 12, ll. 48, 49 for "amplification" read --amplifying--;
Col. 12, l. 50 for "integration" read --integrating--;
Col. 12, l. 53 for "the" read --said--;
Col. 12, l. 55 for "the" read --said--;
Col. 13, l. 8 for "the" read --a--;
Col. 13, l. 12 for "integration" read --integrating--;
Col. 13, ll. 12, 13 for "amplification" read --amplifying--;
Col. 13, l. 14 for "integration" read --integrating--;
Col. 13, l. 15 for "the" read --said--;
Col. 14, l. 2 for "the" read --said--;

UNITED STATES PATENT AND TRADEMARK OFFICE
CERTIFICATE OF CORRECTION

PATENT NO. : 4,411,002

DATED : October 18, 1983

INVENTOR(S) : Robert L. Auger

It is certified that error appears in the above—identified patent and that said Letters Patent is hereby corrected as shown below:

Col. 14, l. 6 for "the" second occurrence read --said--.

Signed and Sealed this

Seventeenth Day of April 1984

[SEAL]

Attest:

GERALD J. MOSSINGHOFF

Attesting Officer

Commissioner of Patents and Trademarks